(12) United States Patent
Hung

(10) Patent No.: US 10,729,025 B1
(45) Date of Patent: Jul. 28, 2020

(54) DISPLAY DEVICE WITH LOCK COVER STRUCTURE

(71) Applicant: CAL-COMP BIG DATA, INC., New Taipei (TW)

(72) Inventor: Ming-Hua Hung, New Taipei (TW)

(73) Assignee: CAL-COMP BIG DATA, INC., New Taipei (TW)

( * ) Notice: Subject to any disclaimer, the term of this patent is extended or adjusted under 35 U.S.C. 154(b) by 0 days.

(21) Appl. No.: 16/553,610

(22) Filed: Aug. 28, 2019

(30) Foreign Application Priority Data

Jun. 4, 2019 (TW) .............................. 108207093 U

(51) Int. Cl.
  *H05K 7/02* (2006.01)
  *H05K 7/04* (2006.01)
  *H05K 5/02* (2006.01)
  *E05B 65/00* (2006.01)
  *H05K 5/00* (2006.01)
  *H05K 5/03* (2006.01)
  *E05C 1/00* (2006.01)

(52) U.S. Cl.
  CPC ....... *H05K 5/0221* (2013.01); *E05B 65/0067* (2013.01); *E05C 1/002* (2013.01); *H05K 5/0017* (2013.01); *H05K 5/0217* (2013.01); *H05K 5/03* (2013.01)

(58) Field of Classification Search
  USPC ................................ 361/801, 809, 737, 756
  See application file for complete search history.

(56) References Cited

U.S. PATENT DOCUMENTS

| | | | | |
|---|---|---|---|---|
| 5,350,213 A | * | 9/1994 | Bernardo | B60J 7/041 160/133 |
| 5,609,066 A | * | 3/1997 | Bunker | B60T 7/047 74/523 |
| 10,575,416 B2 | * | 2/2020 | Li | H05K 5/0017 |
| 2008/0245973 A1 | * | 10/2008 | Neushul | G02B 27/023 250/485.1 |
| 2009/0264168 A1 | * | 10/2009 | Wang | H04M 1/0237 455/575.4 |

* cited by examiner

*Primary Examiner* — Hung S. Bui
(74) *Attorney, Agent, or Firm* — Chun-Ming Shih; HDLS IPR Services

(57) ABSTRACT

A display device (10) includes a main body (1), a sliding cover (2) and a lock cover structure (3). The main body (1) has a display screen (11) and a perforation (12); the sliding cover (2) is slidably mounted onto the main body (1) and capable of sliding in a moving direction (d1) between a covering position and an exposed position; the sliding cover (2) has a slot (21) corresponding to the perforation (12) when the slot (21) is situated at the exposed position; the lock cover structure (3) is accommodated in the main body (1) and includes a hammer unit (31) and a moving plunger (32); the hammer unit (31) is pivotally coupled to the main body (1) and defines a direction of gravity (d2); and the moving plunger (32) has an end passing through the perforation (12) and the other end connected to the hammer unit (31).

9 Claims, 6 Drawing Sheets

DISPLAY DEVICE WITH LOCK COVER STRUCTURE

BACKGROUND OF THE INVENTION

1. Technical Field

The technical field relates to a display device capable of locking the position of a sliding cover, and more particularly to a display device with a lock cover structure.

2. Description of Related Art

In recent years, the technology of mobile devices such as mobile phones and tablet PCs grows fast, and users mainly use the mobile devices for reading, taking pictures, playing games, watching movies and having funs. In general, a mobile device is operated at its upright position, but when the users are playing games, watching movies or doing other activities, the mobile device may be set horizontally to facilitate the users to see the screen of the mobile device However, if the mobile device is installed with a sliding cover, then when the mobile device is set horizontally, the sliding cover will slide down to cover the screen easily due to gravity, or the users have to pull a positioning structure to restrict and prevent the sliding cover from sliding down. As a result, the operation of the mobile device requires an extra action to pull the positioning structure. Therefore, it is an important subject of this disclosure to provide the effects of omitting the extra action to pull the positioning structure and locking the position of the sliding cover.

In view of the aforementioned drawbacks of the prior art, the discloser of this disclosure based on years of experience in the related industry to conduct extensive research and experiment, and finally provided a feasible solution as disclosed in this disclosure to overcome the drawbacks of the prior art.

SUMMARY OF THE INVENTION

Therefore, it is a primary object of this disclosure to overcome the drawbacks of the prior art by providing a display device with a lock cover structure and using the gravity of a hammer unit to lock or unlock the sliding cover automatically, so that the display device provides a greater convenience of use.

To achieve the aforementioned and other objectives, this disclosure discloses an embodiment of a display device with a lock cover structure, comprising: a main body, having a display screen and a through hole; a sliding cover, slidably mounted onto the main body, and sliding along a moving direction between a covering position where the display screen is covered and an exposed position where the display screen is exposed and the sliding cover having a slot configured to be corresponsive to the through hole when the sliding cover is situated at the exposed position; and a lock cover structure, accommodated in the main body, and further comprising: a hammer unit, pivotally coupled to the main body and defining a direction of gravity; and a moving plunger, with an end passing through the through hole and the other end coupled to the hammer unit, and the moving plunger being capable of moving with the hammer unit; wherein when the sliding cover is situated at the exposed position and the direction of gravity is parallel to a moving direction, the moving plunger is dragged by the hammer unit to protrude out from the through hole and be inserted into the slot.

Based on the above, when the display device is set horizontally, the gravity of the hammer unit is used to lock the sliding cover automatically, and when the display device is set vertically, the gravity of the hammer unit is used to unlock the sliding cover automatically, so that the users no longer need any extra action to pull the positioning structure anymore, but simply set the display device to a different position in order to lock or unlock the sliding cover automatically and improve the convenience of use of the display device.

DESCRIPTION OF THE PREFERRED EMBODIMENTS

Figure 1:
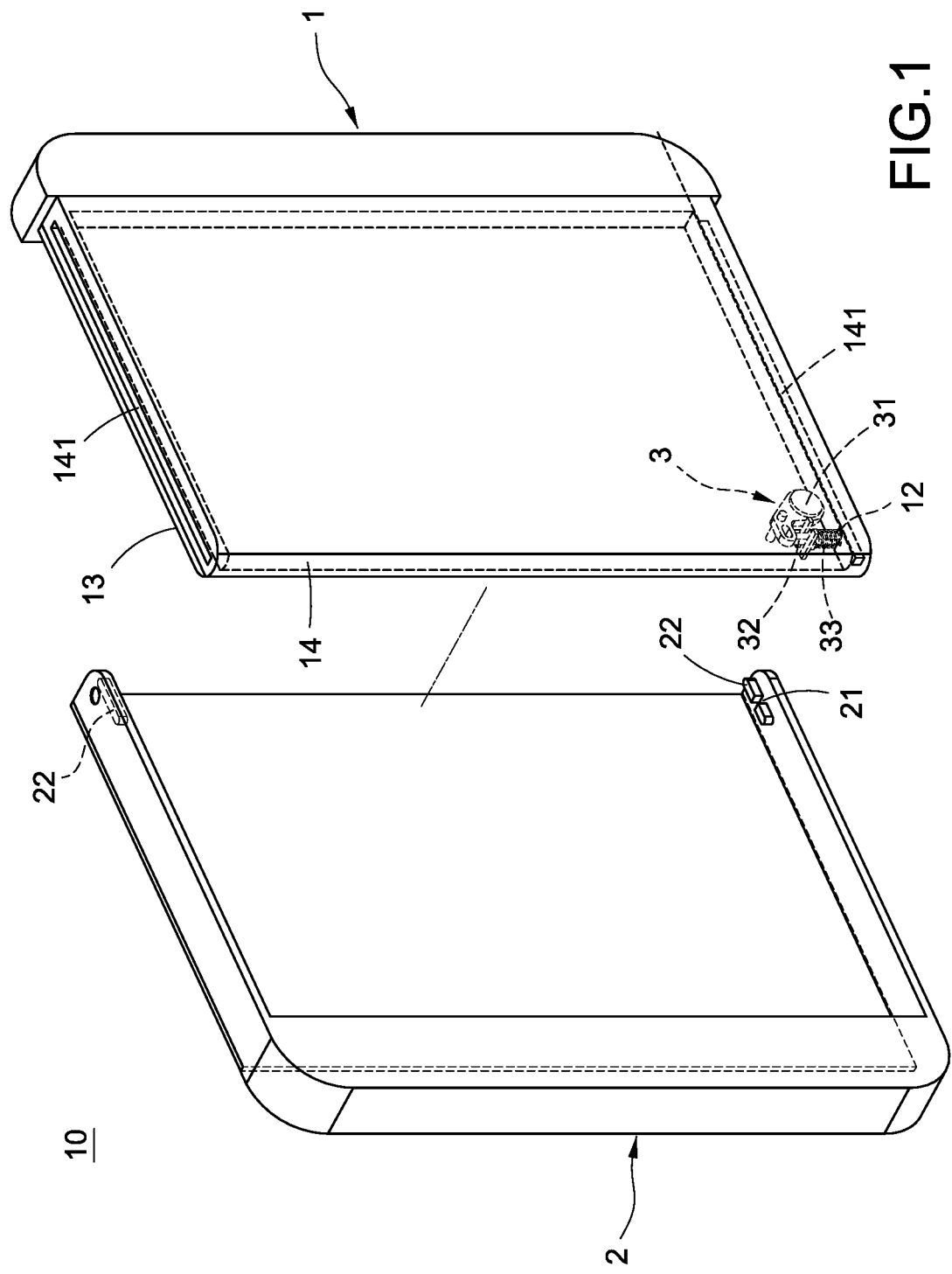
FIG. 1 is an exploded view of a display device of this disclosure.
Figure 2:
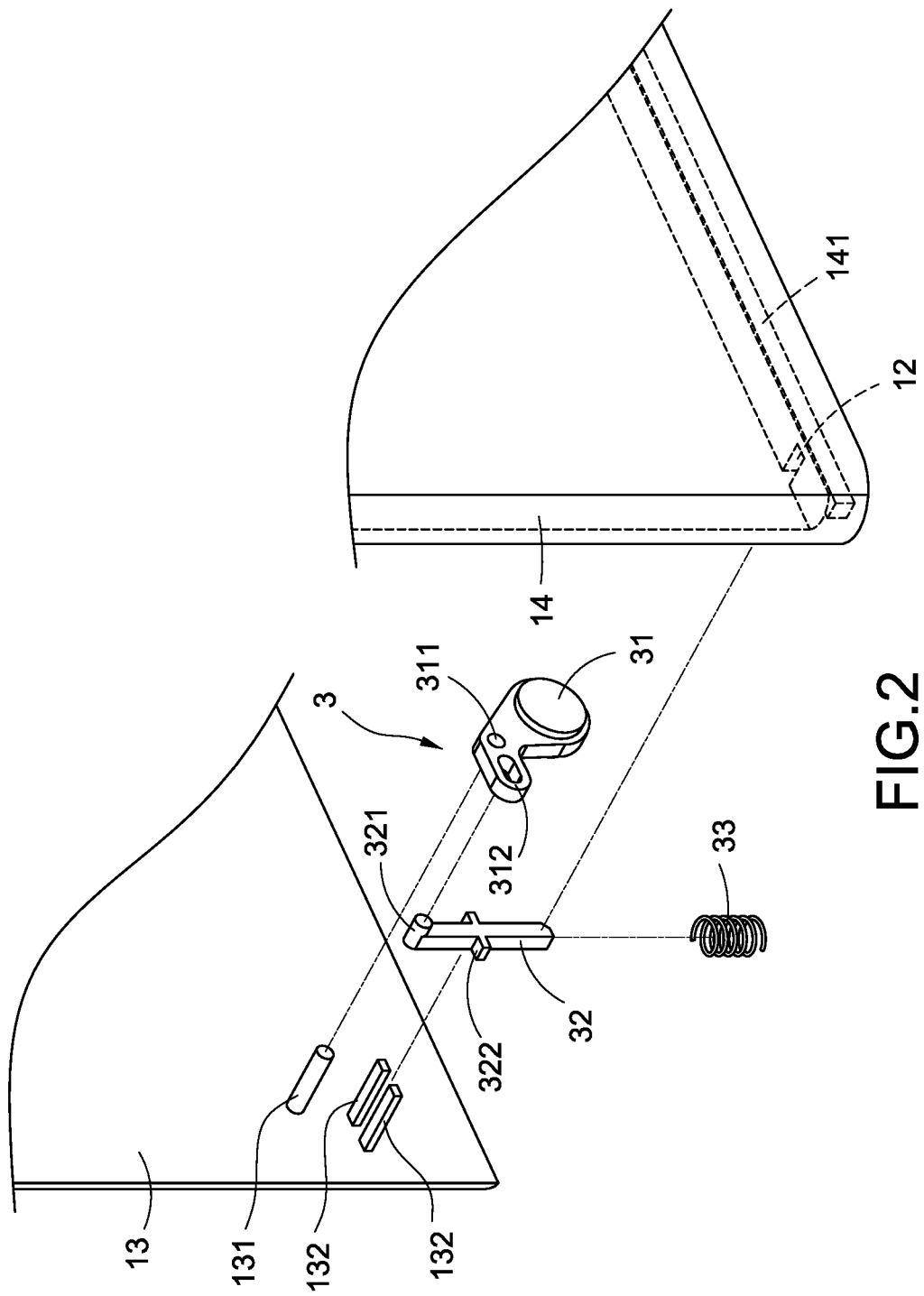
FIG. 2 is another exploded view of a display device of this disclosure.

The technical contents of this disclosure will become apparent with the detailed description of preferred embodiments accompanied with the illustration of related drawings as follows. It is intended that the embodiments and drawings disclosed herein are to be considered illustrative rather than restrictive.

With reference to FIGS. 1 to 6 for a display device with a lock cover structure of the present disclosure, the display device 10 comprises a main body 1, a sliding cover 2, and a lock cover structure 3.

In FIGS. 1 to 6, the main body 1 has a display screen 11 and a through hole 12, and the main body 1 further includes a bottom panel 13 and a side panel 14 perpendicular to each other, and the bottom panel 13 has a fixed column 131 and two limit columns 132.

In this embodiment, the through hole 12 is formed on the side panel 14. Specifically, the side panel 14 has two rails 14 disposed on both sides of the display screen 11 respectively, and the through hole 12 is formed on a bottom wall of one of the rails 141.

In FIGS. 1, and 3 to 6, the sliding cover 2 is slidably mounted onto the main body 1 and capable of sliding along a moving direction d1 between a covering position where the display screen 11 is covered and an exposed position where the display screen 11 is exposed, and the sliding cover 2 has a slot 21. When the sliding cover 2 is situated at the exposed position, the slot 21 is configured to be corresponsive to the through hole 12, and two sliding blocks 22 extend from both sides of the sliding cover 2 respectively and slide along the two rails 141, and the slot 21 is formed on one of the sliding blocks 22.

In FIGS. 1 to 6, the lock cover structure 3 is accommodated in the main body 1, and the lock cover structure 3 comprises a hammer unit 31 and a moving plunger 32.

Further, the hammer unit 31 is pivotally coupled to the main body 1 and capable of rotating with respect to the main body 1, and the hammer unit 31 defines a direction of gravity d2 perpendicular to the ground, and the moving plunger 32 has an end passing through the through hole 12 and the other end coupled to the hammer unit 31, so that the moving plunger 32 is capable of moving with the hammer unit 31 and selectively protruding out from the through hole 12 or hiding into the through hole 12.

In addition, the hammer unit 31 has a pivoting hole 311, and the hammer unit 31 is rotatably sheathed on the fixed column 131 through the pivoting hole 311, so that the hammer unit 31 can rotate with respect to the main body 1.

In addition, the hammer unit 31 has a socket ring 312 extending from an end thereof, and the moving plunger 32 has a connecting block 321 extending therefrom, and the connecting block 321 is passed and coupled to the socket ring 312 in order to move together with the socket ring 312, and the moving plunger 32 is clamped between two limit columns 132 to guide the moving plunger 32 to pass through the through hole 12 and prevent the moving plunger 32 from separating from the through hole 12.

Wherein, when the direction of gravity d2 is perpendicular to the moving direction d1, the force at an equilibrium position of the hammer unit 31 will drive the moving plunger 32 to move in a direction away from the through hole 12; and when the direction of gravity d2 is parallel to the moving direction d1, the force at an equilibrium position of the hammer unit 31 will drive the moving plunger 32 to move in a direction towards the through hole 12.

In addition, the lock cover structure 3 further comprises a restoring spring 33, and the moving plunger 32 has a stopper 322 extending between the through hole 12 and the connecting block 321, and the restoring spring 33 is included between the side panel 14 and the stopper 322, and the restoring spring 33 pushes the moving plunger 32 through the stopper 322 to move in a direction away from the side panel 14, the restoring spring 33 provides a restoring force to the moving plunger 32 to maintain the moving plunger 32 at a position to hide in the through hole 12, so that the moving plunger 32 will not protrude out from the through hole 12.

Figure 3:
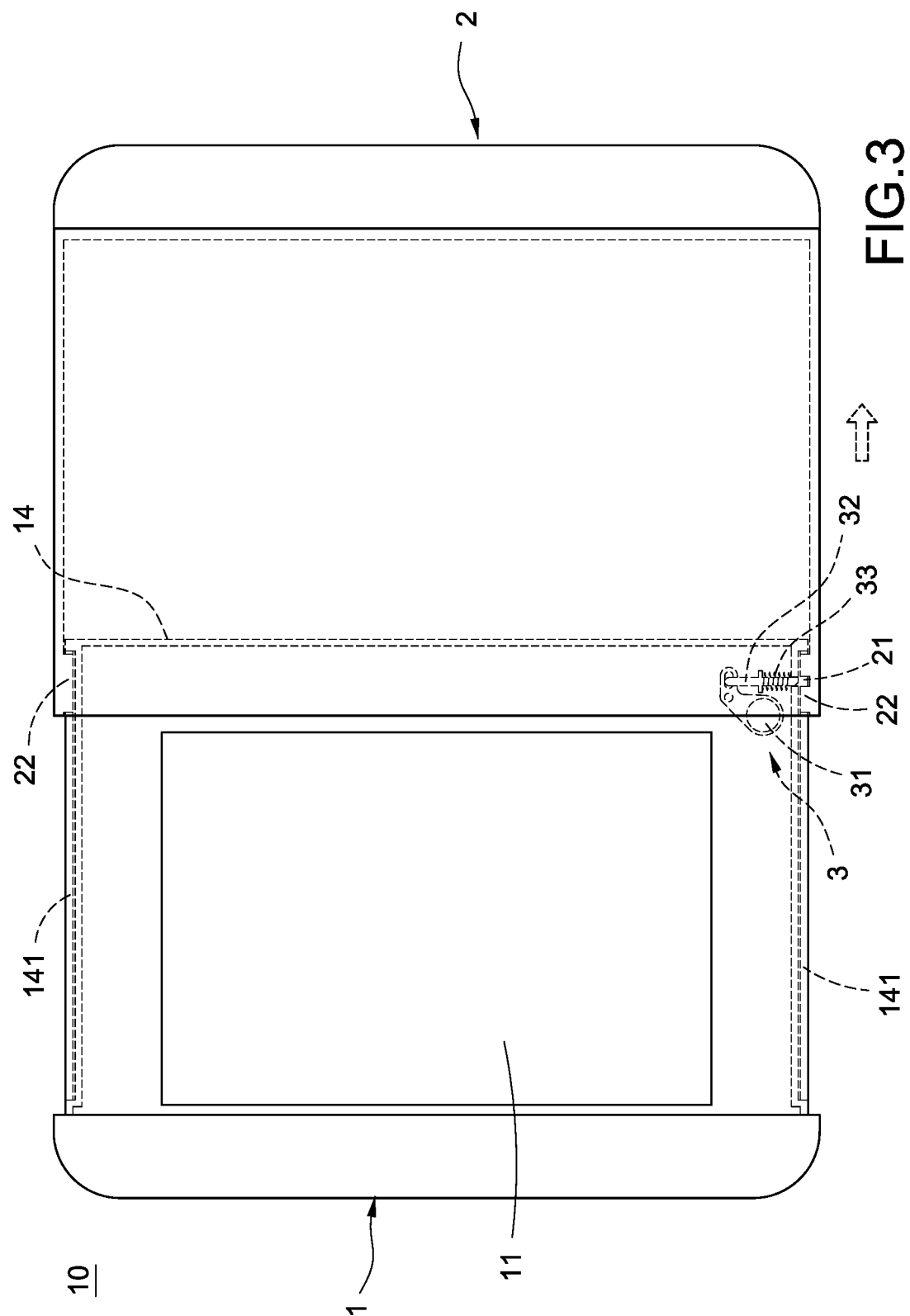
FIG. 3 is a schematic view showing a using status of a display device of this disclosure.
Figure 4:
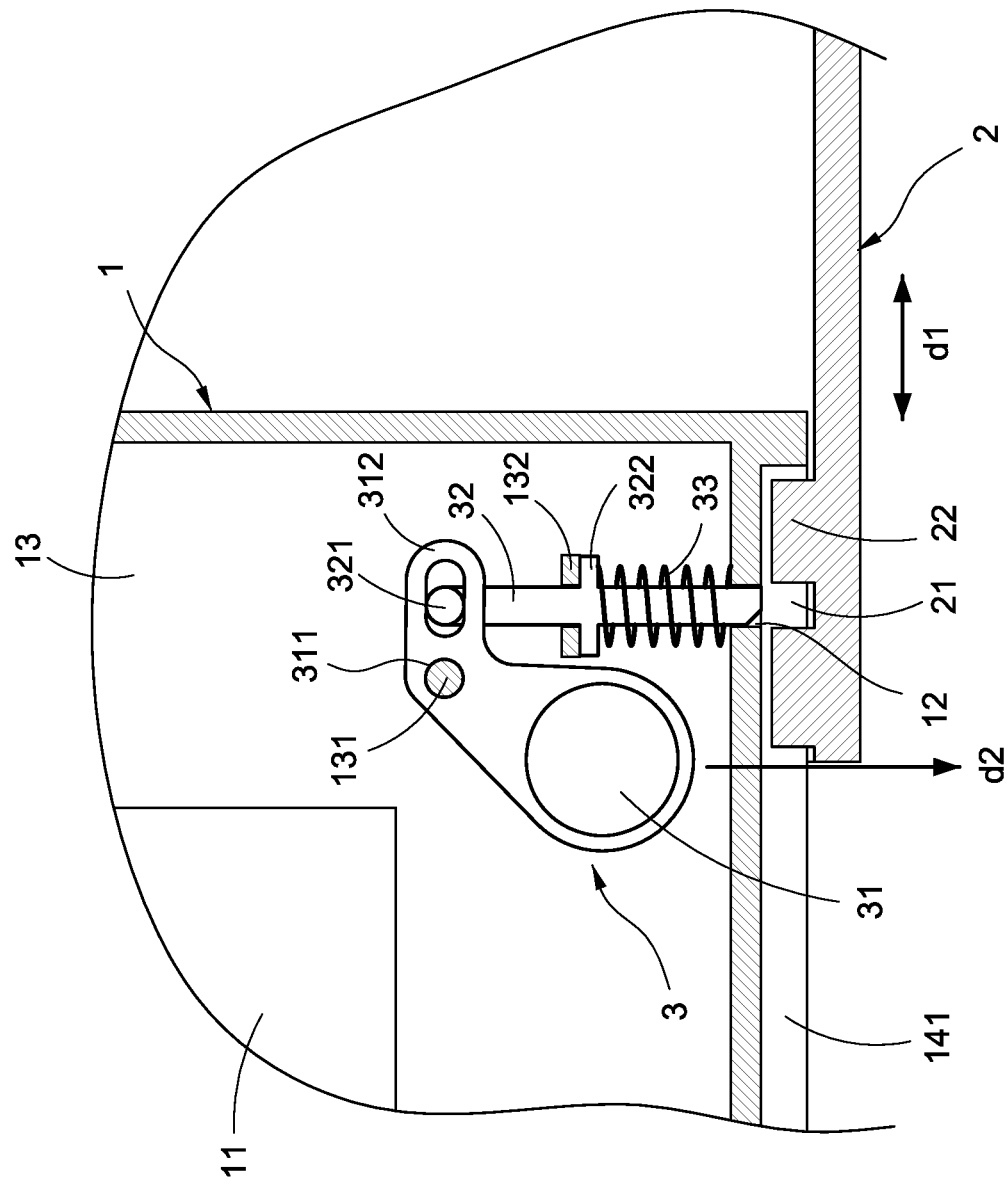
FIG. 4 is a partial blowup view of a display device of this disclosure.
Figure 5:
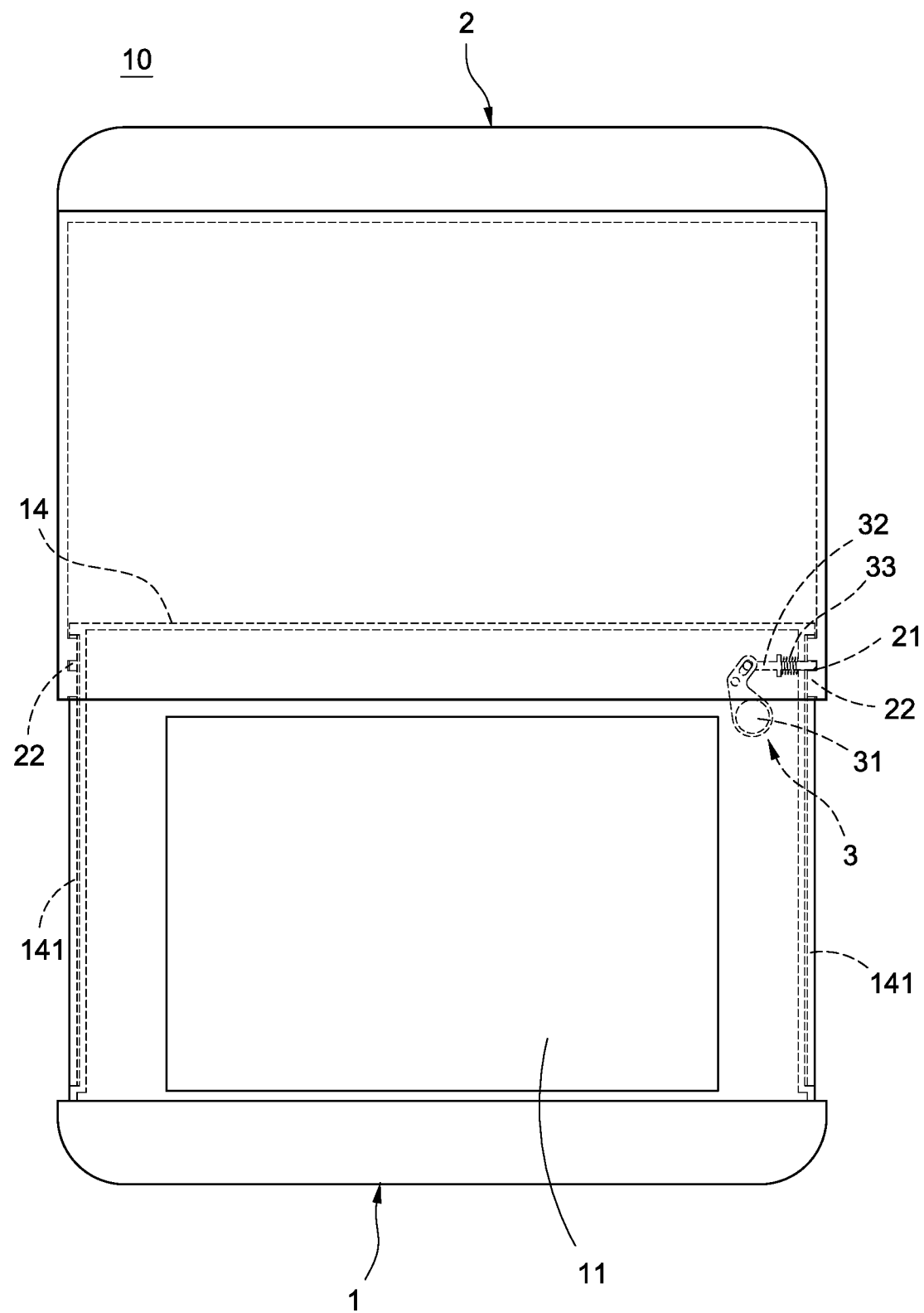
FIG. 5 is another schematic view showing a using status of a display device of this disclosure.
Figure 6:
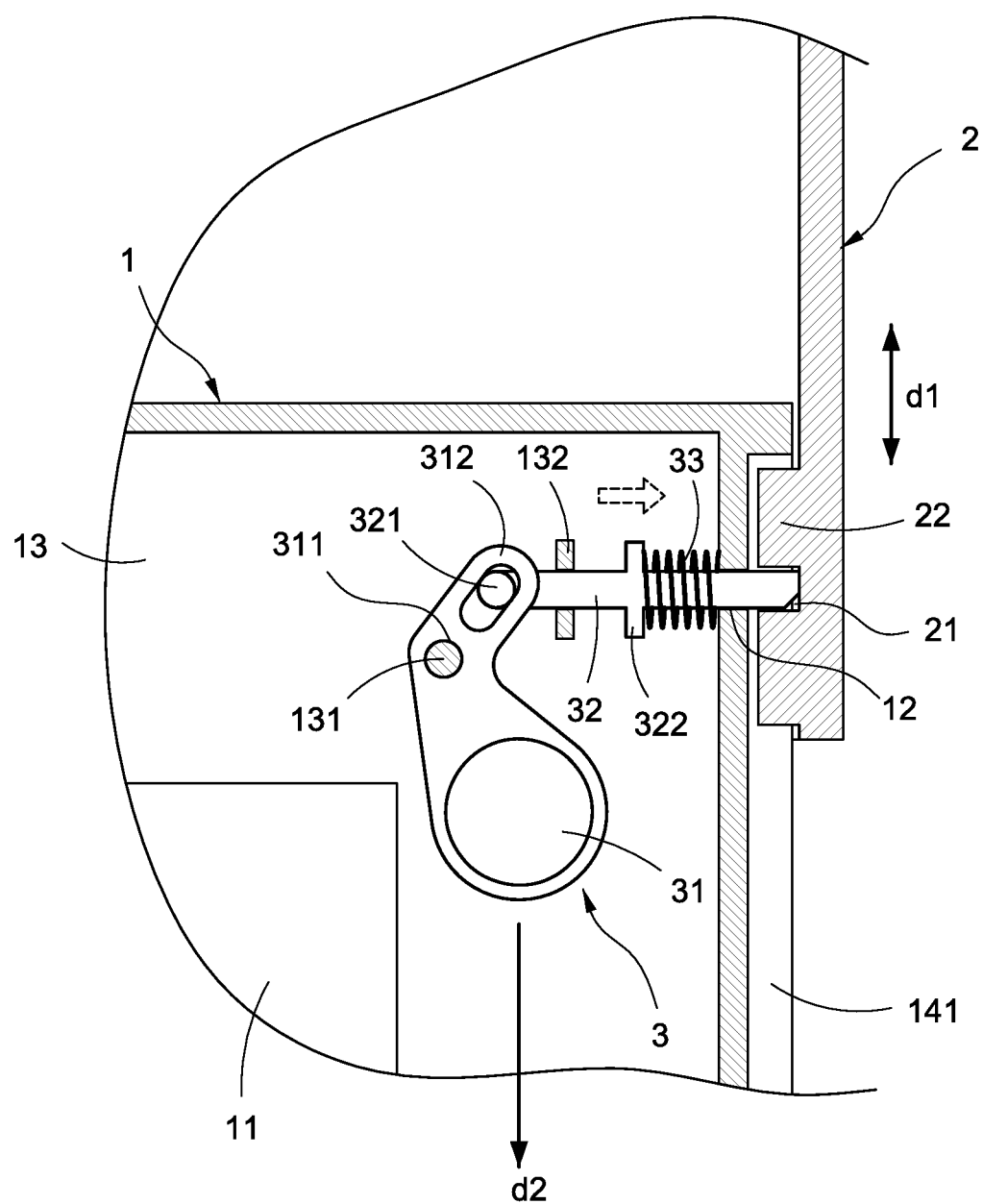
FIG. 6 is another partial blowup view of a display device of this disclosure.

With reference to FIGS. 3 to 6 for the using status of the display device 10 of the present disclosure, when the display device 10 is set vertically as shown in FIGS. 3 and 4, the main body 1 and the sliding cover 2 are disposed side by side with each other. In other words, if the direction of gravity d2 of the hammer unit 31 is perpendicular to the moving direction d1 of the sliding cover 2, the force at an equilibrium position of the hammer unit 31 will drive the moving plunger 32 to hide into the through hole 12, and the restoring force of the restoring spring 33 is greater than the gravity of the hammer unit 31, so that the moving plunger 32 is dragged by the hammer unit 31 and the restoring spring 33 to hide in the through hole 12. When the display device 10 is set horizontally as shown in FIGS. 5 and 6, the sliding cover 2 is disposed above the main body 1. In other words, the sliding cover 2 is situated at the exposed position. The direction of gravity d2 is parallel to the moving direction d1, the force at an equilibrium position of the hammer unit 31 will drive the moving plunger 32 to protrude out from the through hole 12, and the restoring force of the restoring spring 33 is smaller than the gravity of the hammer unit 31, so that the moving plunger 32 is dragged by the hammer unit 31 to protrude out from the through hole 12 and to be inserted into the slot 21.

When the direction of gravity d2 of the hammer unit 31 is inclined to the moving direction d1 of the sliding cover 2, the restoring force of the restoring spring 33 is greater than the gravity of the hammer unit 31, so that the moving plunger 32 is dragged by the restoring spring 33 to hide in the through hole 12.

Therefore, only the sliding cover 2 is disposed above the main body 1, while the sliding cover 2 is being situated at an exposed position to expose the display screen 11, and the moving plunger 32 protrudes out from the through hole 12 and is inserted into the slot 21. At other times, the moving plunger 32 will hide into the through hole 12 automatically.

When the display device 10 is set horizontally, the gravity of the hammer unit 31 is used to lock the sliding cover 2 automatically. When the display device 10 is set vertically, the gravity of the hammer unit 31 is used to unlock the sliding cover 2, so that users no longer need any extra action such as pulling the positioning structure, but simply set the display device 10 to a different position to achieve the effect of locking/unlocking the sliding cover 2 automatically, so as to improve the convenience of use of the display device 10.

In addition, the sliding cover 2 of the present disclosure has a surface including but not limited to a mirror, so that when the sliding cover 2 is situated at the exposed position, the mirror of the sliding cover 2 can be disposed on a side of the display screen 11 to allow the users to watch the mirror while checking their skin, receiving maintenance tips, watching movies or using applications APP through the display screen 11, so as to achieve the same function of a commercial smart mirror.

In summation of the description above, the display device with a lock cover structure of the present disclosure can achieve the expected effects and overcome the drawbacks of the prior art, and the disclosure complies with the patent application requirements, and is thus duly filed for patent application. While this disclosure has been described by means of specific embodiments, numerous modifications and variations could be made thereto by those skilled in the art without departing from the scope and spirit of this disclosure set forth in the claims.

What is claimed is:

1. A display device with a lock cover structure, comprising:
   a main body, having a display screen and a through hole;
   a sliding cover, slidably mounted onto the main body, and sliding along a moving direction between a covering position where the display screen is covered an exposed position where the display screen is exposed and the sliding cover having a slot configured to be corresponsive to the through hole when the sliding cover is situated at the exposed position; and
   a lock cover structure, accommodated in the main body, and further comprising:
   a hammer unit, pivotally coupled to the main body and defining a direction of gravity; and
   a moving plunger, with an end passing through the through hole and the other end coupled to the hammer unit, and the moving plunger being capable of moving with the hammer unit;
   wherein, when the sliding cover is situated at the exposed position and the direction of gravity is parallel to a moving direction, the moving plunger is dragged by the hammer unit to be protruding from the through hole and inserted into the slot.

2. The display device with a lock cover structure according to claim 1, wherein when the direction of gravity is perpendicular to the moving direction, the moving plunger is dragged by the hammer unit to hide in the through hole.

3. The display device with a lock cover structure according to claim 1, wherein the main body has a bottom panel and a side panel perpendicular to each other, and the bottom panel has a fixed column, and the hammer unit has a pivoting hole, and the hammer unit is rotatably sheathed on the fixed column through the pivoting hole, and the through hole is formed on the side panel.

4. The display device with a lock cover structure according to claim 3, wherein the hammer unit has a socket ring extending from an end thereof, and the moving plunger has a connecting block extending therefrom, and the connecting block is passed and coupled to the socket ring.

5. The display device with a lock cover structure according to claim 4, wherein the lock cover structure further comprises a restoring spring, and the moving plunger further comprises a stopper installed and extending between the through hole and the connecting block, and the restoring spring is clamped between the side panel and the stopper.

6. The display device with a lock cover structure according to claim 5, wherein when the direction of gravity is perpendicular to the moving direction, the moving plunger is dragged by the restoring spring to hide in the through hole.

7. The display device with a lock cover structure according to claim 3, wherein the bottom panel has two limit columns, and the moving plunger is clamped between the two limit columns.

8. The display device with a lock cover structure according to claim 3, wherein the side panel has two rails disposed on both sides of the display screen respectively, and two sliding blocks disposed on both sides of the sliding cover and sliding along the two rails respectively.

9. The display device with a lock cover structure according to claim 8, wherein the through hole is formed on a bottom wall of one of the rails, and the slot is formed on one of the sliding blocks.

* * * * *